United States Patent
Kim et al.

(10) Patent No.: US 9,093,736 B2
(45) Date of Patent: Jul. 28, 2015

(54) COMMON MODE FILTER AND METHOD FOR MANUFACTURING THE SAME

(75) Inventors: Jin Gu Kim, Gyunggi-do (KR); Jong Yun Lee, Incheon (KR); Young Do Kweon, Seoul (KR); Chang Bae Lee, Gyunggi-do (KR); Young Seuck Yoo, Seoul (KR)

(73) Assignee: Samsung Electro-Mechanics Co., Ltd., Gyunggi-Do (KR)

(*) Notice: Subject to any disclaimer, the term of this patent is extended or adjusted under 35 U.S.C. 154(b) by 440 days.

(21) Appl. No.: 13/472,195

(22) Filed: May 15, 2012

(65) Prior Publication Data

US 2013/0169382 A1   Jul. 4, 2013

(30) Foreign Application Priority Data

Dec. 28, 2011   (KR) .................. 10 2011 0144761

(51) Int. Cl.
| | |
|---|---|
| *H03H 7/01* | (2006.01) |
| *H05K 3/00* | (2006.01) |
| *H01P 1/203* | (2006.01) |
| *H03H 1/00* | (2006.01) |
| *H04B 3/28* | (2006.01) |

(Continued)

(52) U.S. Cl.
CPC ........ *H01P 1/20345* (2013.01); *H01F 17/0013* (2013.01); *H03H 1/0007* (2013.01); *H03H 7/427* (2013.01); *H04B 3/28* (2013.01); *H01F 2017/0093* (2013.01); *H03H 2001/0085* (2013.01)

(58) Field of Classification Search
CPC .......... H03H 2001/0085; H03H 7/427; H03H 1/0007; H01P 1/20345
USPC .................. 333/12, 181, 185; 427/97.1, 97.6; 336/200
See application file for complete search history.

(56) References Cited

U.S. PATENT DOCUMENTS

| | | | | |
|---|---|---|---|---|
| 4,871,584 A | * | 10/1989 | Weber | .......................... 427/96.9 |
| 5,612,656 A | * | 3/1997 | Sakamoto et al. | ............ 333/204 |

(Continued)

FOREIGN PATENT DOCUMENTS

| | | |
|---|---|---|
| JP | 06-053045 | 2/1994 |
| JP | 2004-006924 | 1/2004 |

(Continued)

OTHER PUBLICATIONS

Office action dated Aug. 20, 2013 from corresponding Japanese Patent Application No. 2012-110683 and its English summary provided by the clients.

(Continued)

*Primary Examiner* — Benny Lee
*Assistant Examiner* — Rakesh Patel
(74) *Attorney, Agent, or Firm* — Ladas & Parry, LLP

(57) ABSTRACT

Disclosed herein are a common mode filter and a method for manufacturing the same. The common mode filter includes a first insulator sheet; a first circuit layer having a first-layered first coil and a first-layered second coil alternately and separately arranged; a second insulator sheet laminated on the first circuit layer; and a second circuit layer having a second-layered first coil and a second-layered second coil alternately and separately arranged, the second-layered first coil being connected to the first-layered first coil and the second-layered second coil being connected to the first-layered second coil through the plurality of penetration holes.

11 Claims, 7 Drawing Sheets

(51) Int. Cl.
*H03H 7/42* (2006.01)
*H01F 17/00* (2006.01)

(56) References Cited

U.S. PATENT DOCUMENTS

| 6,020,798 | A  | * | 2/2000  | Nakakubo et al. | 333/204 |
| 7,368,998 | B2 | * | 5/2008  | Abe et al.      | 330/307 |
| 2001/0033219 | A1 | * | 10/2001 | Iha et al.   | 336/90  |
| 2011/0074526 | A1 | * | 3/2011  | Taniguchi    | 333/185 |
| 2013/0154767 | A1 | * | 6/2013  | Kim et al.   | 333/185 |

FOREIGN PATENT DOCUMENTS

| JP | 2004-303776 | 10/2004 |
| JP | 2004-304157 | 10/2004 |
| JP | 2006-190934 | 7/2006 |
| JP | 2007-103686 | 4/2007 |
| KR | 10-0745540  | 8/2007  |

OTHER PUBLICATIONS

Office Action dated Jan. 18, 2013 for related Korean Patent Application No. 10-2011-0144761 and its English summary.

* cited by examiner

COMMON MODE FILTER AND METHOD FOR MANUFACTURING THE SAME

CROSS REFERENCE TO RELATED APPLICATION

This application claims the benefit of Korean Patent Application No. 10-2011-0144761, filed on Dec. 28, 2011, entitled "Common Mode Filter and Manufacturing Method thereof", which is hereby incorporated by reference in its entirety into this application.

BACKGROUND OF THE INVENTION

1. Technical Field

The present invention relates to a common mode filter and a method for manufacturing the same.

2. Description of the Related Art

Due to recent developed system configuration and increased data capacity, a high transmission rate is required, and for this high transmission rate, a differential signal type of transmission is mainly used.

Conventionally, if the signal frequency is increased in order to increase the transmission rate, undesired electromagnetic waves (i.e., noise) are generated due to high frequency of a signal, and the signal and the noise may overlap each other.

Hence, common mode noise is generated due to imbalance between high-rate differential signal lines (i.e., two signal lines).

A common mode filter is mainly used in order to remove this common mode noise. The common mode filter is an EMI filter mainly applied to the high-rate differential signal line.

This common mode filter contributes to improving in EMC characteristics of electronic devices and the like or improving antenna characteristics of cellular phones and the like.

In this common mode filter, a first coil and a second coil formed above the first coil are formed in a vortex shape, and an insulator sheet is formed between the first coil and the second coil.

When a common mode of noise is applied to the first coil and the second coil of the common mode filter of the prior art, impedance values of the respective coils are increased, and thus, the common mode of noise is removed.

However, in the common mode filter of the prior art, build-up layers need to be formed seven times or more, which causes high process costs and decreased yield due to the many processes.

Furthermore, the common mode filter according to the prior art has a track shape, which is unfavorable in reducing the size thereof due to a wide two-dimensional structure.

RELATED ART DOCUMENT

Patent Document (Patent Document 1) Japanese Patent Laid-Open Publication No. Hei 6-53045

SUMMARY OF THE INVENTION

The present invention has been made in an effort to provide a common mode filter for allowing miniaturization thereof at the time of producing products, by realizing a first coil and a second coil on the same plane in oblique lines to provide a two-layered lamination structure.

The present invention has been also made in an effort to provide a method for manufacturing a common mode filter capable of reducing the number of processes to achieve cost cutting, by realizing a first coil and a second coil on the same plane in oblique lines.

According to a preferred embodiment of the present invention, there is provided a common mode filter, including: a first insulator sheet; a first circuit layer formed on the first insulator sheet and having a first-layered first coil and a first-layered second coil alternately and separately arranged; a second insulator sheet laminated on the first circuit layer and having a pair of penetration hole rows constituted of a plurality of penetration holes connected to the first-layered first coil and the first-layered second coil; and a second circuit layer formed on the second insulator sheet and having a second-layered first coil and a second-layered second coil alternately and separately arranged, the second-layered first coil being connected to the first-layered first coil and the second-layered second coil being connected to the first-layered second coil through the plurality of penetration holes.

The common mode filter may further include: a third insulator sheet formed on a surface opposite to a surface of the first insulator sheet on which the first circuit layer is formed; and a fourth insulator sheet laminated on the second circuit layer.

The third insulator sheet may be formed of any one of $Al_2O_3$, AlN, glass, and a quartz substrate.

The common mode filter may further include a pair of input and output electrodes formed on lateral surfaces of a laminate consisting of the first insulator sheet, the first circuit layer, the second insulator sheet, and the first circuit layer.

The first insulator sheet may be formed of any one of polyimide, epoxy resin, benzo cyclobutene (BCB), and other polymers.

The second insulator sheet may be formed of any one of a photosensitive material, polyimide, epoxy resin, benzo cyclobutene (BCB), and other polymers.

The first-layered first coil of the first circuit layer may have plate conductor wires disposed in oblique lines and arranged alternately with each other, and the first-layered second coil of the first circuit layer may have plate conductor wires disposed in oblique lines and arranged alternately with the conductor wires of the first-layered first coil.

The second-layered first coil of the second circuit layer may have plate conductor wires disposed in oblique lines and arranged alternately with each other, and the second-layered second coil of the second circuit layer may have plate conductor wires disposed in oblique lines and arranged alternately with the conductor wires of the second-layered first coil.

According to another preferred embodiment of the present invention, there is provided a method for manufacturing a common mode filter, including: (A) forming a first circuit layer on a first insulator sheet, the first circuit layer having a first-layered first coil and a first-layered second coil alternately and separately arranged; (B) forming a second insulator sheet on the first circuit layer, the second insulator sheet having a plurality of holes corresponding to lands of the first-layered first coil and lands of the first-layered second coil; (C) forming penetration holes in the second insulator sheet by performing plating on the second insulator sheet to fill the holes with a conductive material, and forming a metal layer on the second insulator sheet; and (D) forming a second circuit layer by using the metal layer, the second circuit layer having a second-layered first coil and a second-layered second coil alternately and separately arranged, and the second-layered first coil being connected to the first-layered first coil and the second-layered second coil being connected to the first-layered second coil through the plurality of penetration holes.

The method may further include: (E) preparing a third insulator sheet on a surface opposite to a surface of the first insulator sheet on which the first circuit layer is formed, and laminating the fist insulator sheet on the third insulator sheet, before step (A); and (F) laminating a fourth insulator sheet on the second circuit layer, after step (C).

The third insulator sheet may be formed of any one of $Al_2O_3$, AlN, glass, and a quartz substrate.

The method may further include (G) forming a pair of input and output electrodes on lateral surfaces of a laminate consisting of the first insulator sheet, the first circuit layer, the second insulator sheet, and the second circuit layer.

The first insulator sheet may be formed of any one of polyimide, epoxy resin, benzo cyclobutene (BCB), and other polymers.

The second insulator sheet may be formed of any one of a photosensitive material, polyimide, epoxy resin, benzo cyclobutene (BCB), and other polymers.

Step (B) may include: (B-1) coating and drying a liquid state photosensitive material on the first circuit layer to form the second insulator sheet; and (B-2) forming the plurality of holes corresponding to the lands of the first-layered first coil and the lands of the first-layered second coil in the second insulator sheet.

DESCRIPTION OF THE PREFERRED EMBODIMENTS

Figure 1:
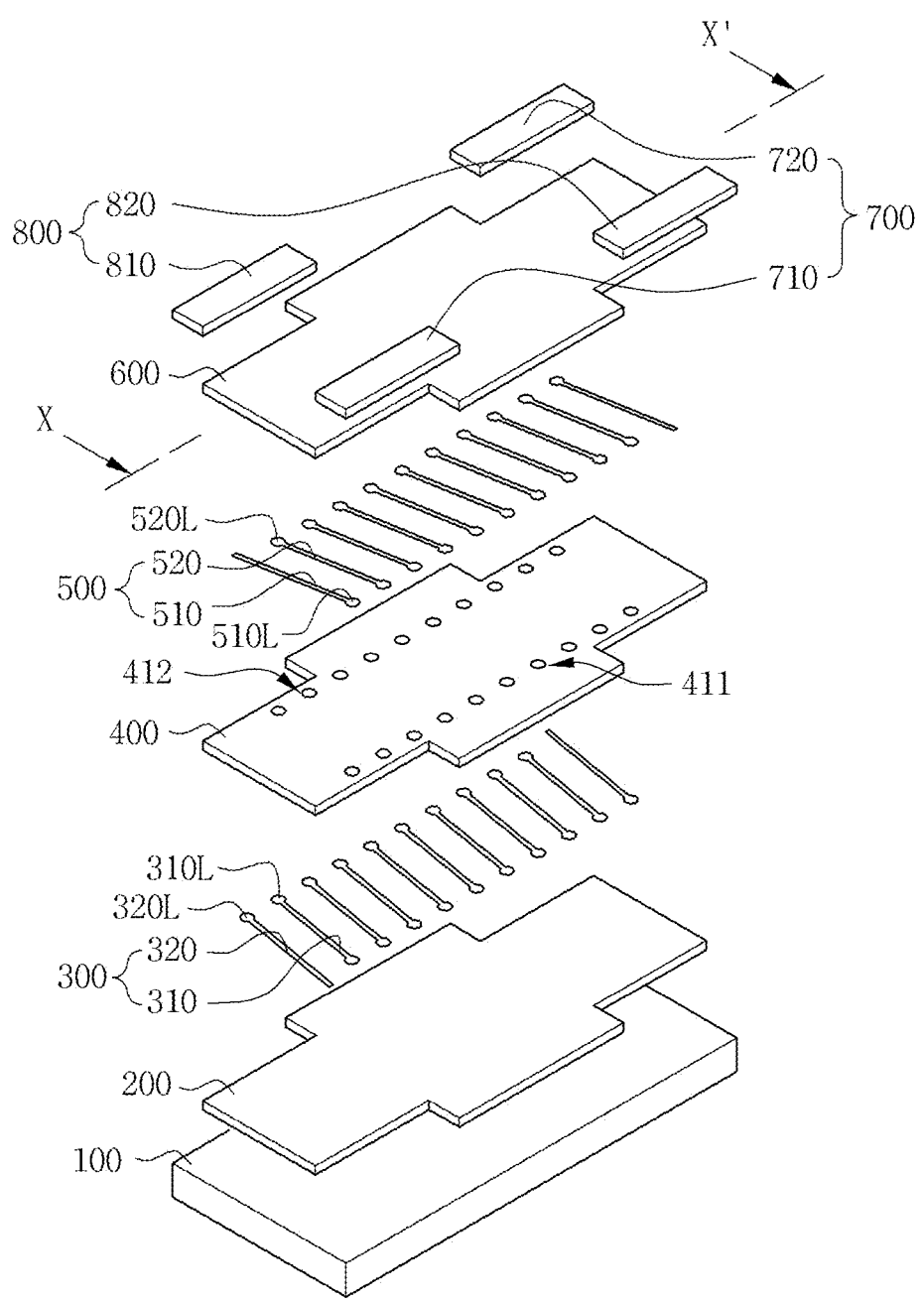
FIG. 1 is an exploded perspective view of a common mode filter according to a first preferred embodiment of the present invention.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

The above and other objects, features and advantages of the present invention will be more clearly understood from the following detailed description taken in conjunction with the accompanying drawings. In the specification, in adding reference numerals to components throughout the drawings, it is to be noted that like reference numerals designate like components even though components are shown in different drawings. Further, in describing the present invention, a detailed description of related known functions or configurations will be omitted so as not to obscure the gist of the present invention.

Hereafter, preferred embodiments of the present invention will be described in detail with reference to the accompanying drawings.

Figure 2:
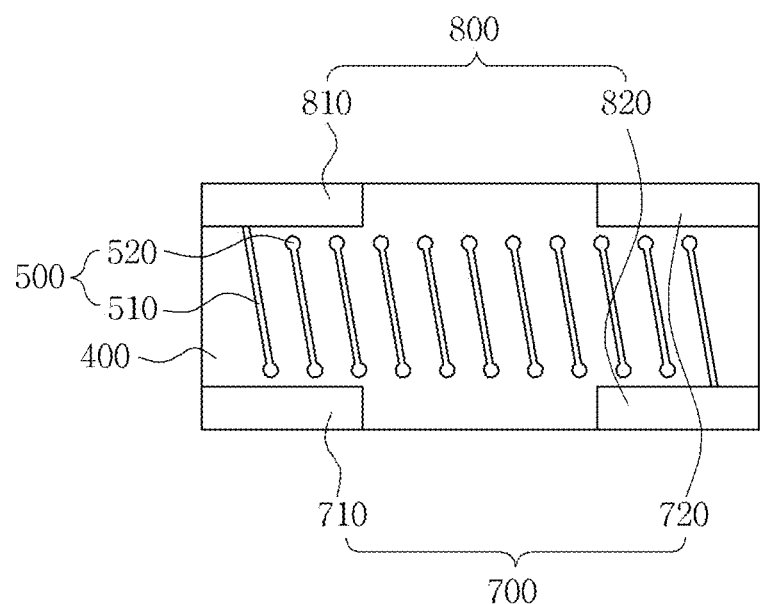
FIG. 2 is a plane view of a second insulator sheet of the common mode filter of FIG. 1.

FIG. 1 is an exploded perspective view of a common mode filter according to a first preferred embodiment of the present invention; FIG. 2 is a plane view of a second insulator sheet of the common mode filter of FIG. 1; and FIG. 3 is a plane view of a first insulator sheet of the common mode filter of FIG. 1.

Figure 3:
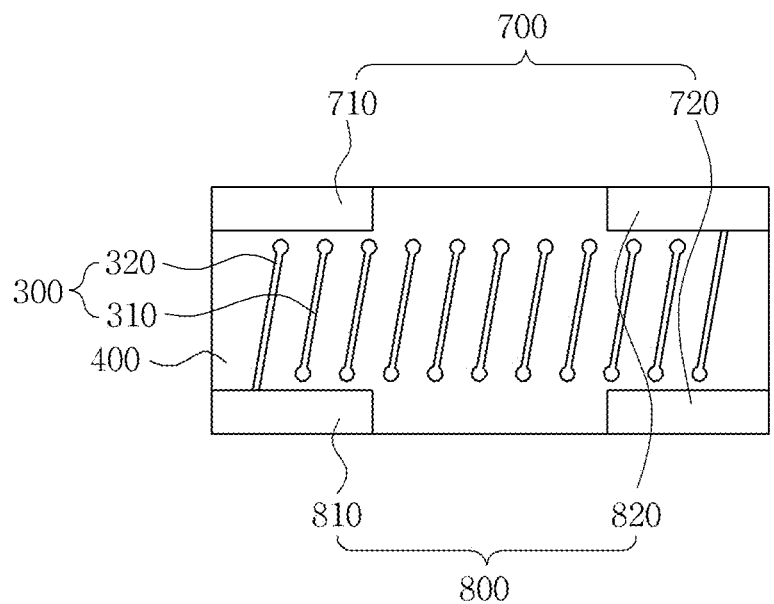
FIG. 3 is a plane view of a first insulator sheet of the common mode filter of FIG. 1.

As shown in FIGS. 1 to 3, a common mode filter according to a first preferred embodiment of the present invention includes a lower insulator sheet 100, a first insulator sheet 200, a first circuit layer 300, a second insulator sheet 400, a second circuit layer 500, and an upper insulator sheet 600, which are sequential from below, and further includes a pair of input and output electrodes 700 and 800 formed on lateral surfaces thereof.

The lower insulator sheet 100 functions to support the common mode filter according to the present invention, and may be formed by selecting any one of $Al_2O_3$, AlN, glass, a quartz substrate, and the like.

The first insulator sheet 200 is formed on an upper surface of the lower insulator sheet 100, and any one selected from polyimide, epoxy resin, benzo cyclobutene (BCB), and other polymers is used as a material therefor. Impedance is controlled by the thickness of the first insulator sheet 200 as above.

The first circuit layer 300 is formed on an upper surface of the first insulator sheet 200.

Here, the first circuit layer 300 is constituted of a first-layered first coil 310 made by arranging plate conductor wires in oblique lines and a first-layered second coil 320 made by arranging plate conductor wires in oblique lines. Respective plate conductor wires of the first-layered first and second coils 310 and 320 are alternately arranged.

As such, the first-layered first coil 310 and the first-layered second coil 320 formed on the upper surface of the first insulator sheet 200 are formed on the same plane, and respective plate conductor wires of the first-layered first and second coils 310 and 320 are alternately arranged such that the first-layered second coil 320 is disposed between the first-layered first coils 310.

Certainly, lands 310L and 320L are formed at both ends of the plate conductor wire and contacted with penetration holes of the second insulator sheet 400 so that the first circuit layer 300 and the second circuit layer 500 are electrically connected to each other.

As such, the first-layered first coil 310 and the first-layered second coil 320 are electrically insulated from each other without causing short circuits since respective plate conductor wires of the first-layered first and second coils 310 and 320 are parallel with each other in oblique lines and are formed alternately with each other.

The plate conductor wires of the first-layered first coil 310 and the first-layered second coil 320 are formed of any one of Ag, Pd, Al, Cr, Ni, Ti, Au, Cu, Pt, and an alloy thereof.

Meanwhile, the second insulator sheet 400 is formed between the first circuit layer 300 and the second circuit layer 500. In order to electrically connect the first circuit layer 300 and the second circuit layer 500 to each other, there are formed a plurality of penetration holes constituting a pair of penetration hole rows 411 and 412 facing each other.

Here, respective penetration holes constituting the pair of penetration hole rows 411 and 412 are apart from each other at a predetermined interval, and are not contacted with each other so that they are electrically insulated from each other.

A photosensitive material is most suitable for this second insulator sheet 400, and beside this, any one selected from polyimide, epoxy resin, benzo cyclobutene (BCB), and other polymers may be used as the material for the second insulator sheet 400. Most preferably, the photosensitive material is used as the material for the second insulator sheet 400, and in this case, the common mode filter can be manufactured in a thin film type.

Then, the second circuit layer 500 is formed on an upper surface of the second insulator sheet 400.

Here, the second circuit layer 500 is constituted of a second-layered first coil 510 made by arranging plate conductor wires in oblique lines and a second-layered second coil 520 made by arranging plate conductor wires in oblique lines. Respective plate conductor wires of the second-layered first and second coils 510 and 520 are alternately arranged.

As such, the second-layered first coil 510 and the second-layered second coil 520 formed on the upper surface of the second insulator sheet 400 are formed on the same plane, and respective plate conductor wires of the second-layered first and second coils 510 and 520 are alternately arranged such that the second-layered second coil 520 is disposed between the second-layered first coils 510.

Certainly, lands 510L and 520L are formed at both ends of the plate conductor wire, and contacted with penetration holes of the second insulator sheet 400 so that the first circuit layer 300 and the second circuit layer 500 are electrically connected to each other. A3

As such, the second-layered first coil 510 and the second-layered second coil 520 are electrically insulated from each other without causing short circuits since respective plate conductor wires of the second-layered first and second coils 510 and 520 are parallel with each other in oblique lines and alternately formed.

These second-layered first coil 510 and second-layered second coil 520 are formed of any one of Ag, Pd, Al, Cr, Ni, Ti, Au, Cu, Pt, and an alloy thereof.

The upper insulator sheet 600 is formed on an upper surface of the second circuit layer 500, and any one selected from polyimide, epoxy resin, benzo cyclobutene (BCB), and other polymers is used as a material therefor.

Meanwhile, a pair of input and output electrodes 700 and 800 corresponding to the respective coils are formed on lateral surfaces of from the first insulator sheet 200 which are laminated above the lower insulator sheet 100 to upper insulator sheet 600.

Here, the pair of input and output electrodes 700 and 800 are for supplying electric power to the common mode filter of the present invention from an external power device.

Of the pair of input and output electrodes 700 and 800, in the input and output electrode 700 corresponding to the first-layered first coil 310 and second-layered first coil 510, an input electrode 710 thereof is connected to the second-layered first coil 510 and an output electrode 720 thereof is connected to the first-layered first coil 310 so that electric power is supplied to the first-layered first coil 310 and the second-layered first coil 510 from the external power device.

Certainly, on the contrary to this, in the input and output electrode 700 corresponding to the first-layered first coil 310 and the second-layered first coil 510, the input electrode 710 may be connected to the first-layered first coil 310 and the output electrode 720 may be connected to the second-layered first coil 510 so that an electric power is supplied to the first-layered first coil 310 and the second-layered first coil 510 from the external power device.

Next, of the pair of input and output electrodes 700 and 800, in the input and output electrode 800 corresponding to the first-layered second coil 320 and the second-layered second coil 520, an input electrode 810 thereof is connected to the second-layered second coil 520 and an output electrode 820 thereof is connected to the first-layered second coil 320 so that electric power is supplied to the first-layered second coil 320 and the second-layered second coil 520 from the external power device.

On the contrary to this, in the input and output electrode 800 corresponding to the first-layered first coil 320 and the second-layered second coil 520, the input electrode 810 may be connected to the first-layered second coil 320 and the output electrode 820 may be connected to the second-layered second coil 520 so that an electric power is supplied to the first-layered second coil 320 and the second-layered second coil 520 from the external power device.

The pair of input and output electrodes 700 and 800 are formed of any one of Ag, Pd, Al, Cr, Ni, Ti, Au, Cu, Pt, and an alloy thereof.

Figure 4A:
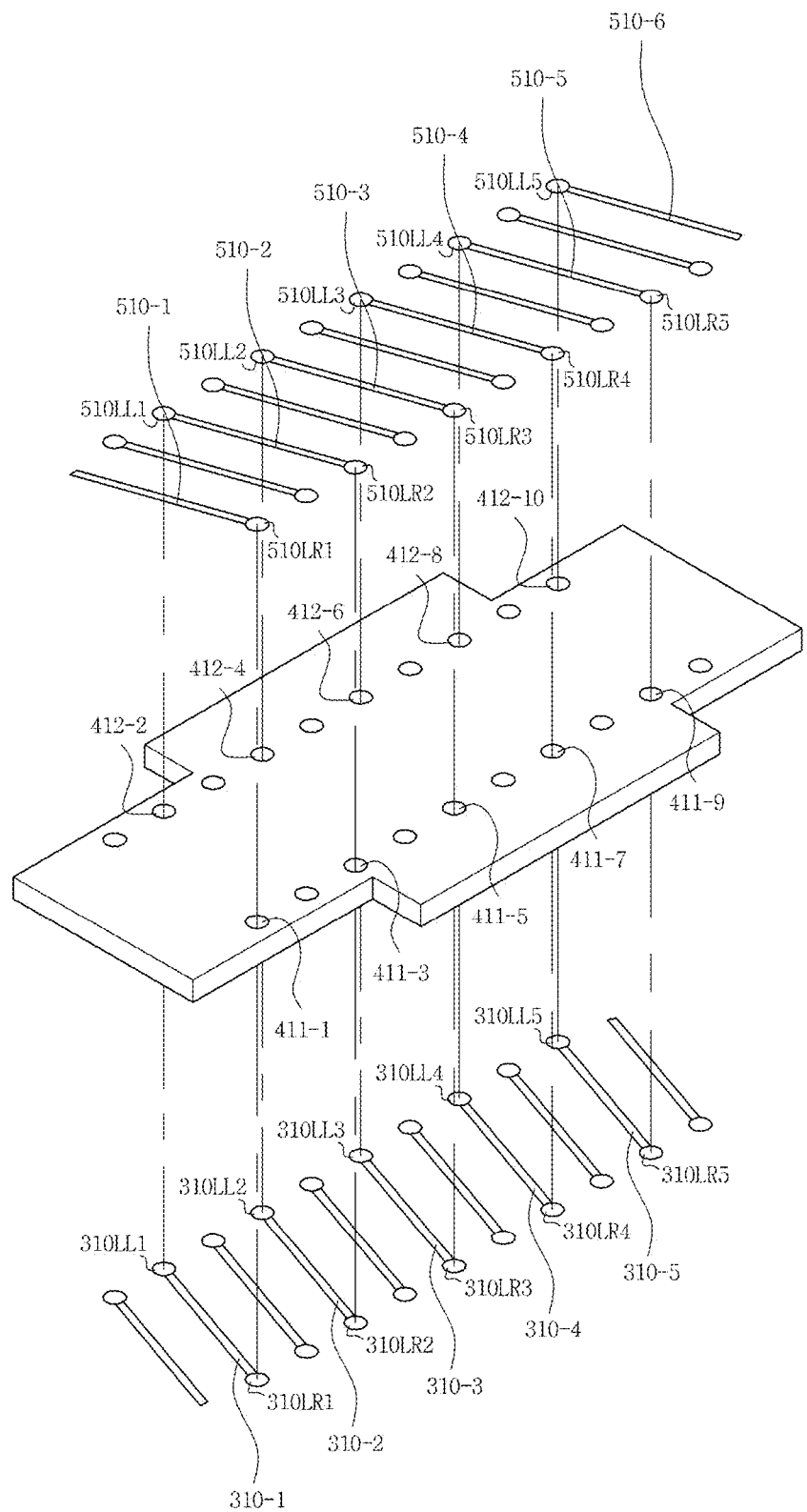
FIGS. 4A and 4B are detailed separate perspective views of a first circuit layer, the second insulator sheet, and a second circuit layer of FIG. 1.

The connection manner in which the first-layered first coil 310 and the second-layered first coil 510 of the common mode filter constituted as above will be described with reference to FIG. 4A, a detailed separate view of the first circuit layer, the second insulator sheet, and the second circuit layer.

A plate conductor wire 510-1 of the second-layered first coil 510 is a starting point. The plate conductor wire 510-1 passes through a land 510LR1, and, as indicated by a dotted line, passes through a corresponding penetration hole 411-1, and then is connected to a land 310LR1 corresponding to the first-layered first coil 310 and then a plate conductor wire 310-1 of the first-layered first coil 310.

Next, the plate conductor wire 310-1 of the first-layered first coil 310 passes through a land 310LL1, and, as indicated by a dotted line, passes through a corresponding penetration hole 412-2, and then is connected to a land 510LL1 corresponding to the second-layered first coil 510 and then a next plate conductor wire 510-2 of the second-layered first coil 510.

In this manner, connection of the coil is performed as follows: the plate conductor wire denoted by 510-2→a land denoted by 510LR2→a penetration hole denoted by 411-3→a land denoted by 310LR2→a plate conductor wire denoted by 310-2→a land denoted by 310LL2→a penetration hole denoted by 412-4→a land denoted by 510LL2→a plate conductor wire denoted by 510-3.

In succession, connection of the coil is performed as follows: the plate conductor wire denoted by 510-3→a land denoted by 510LR3→a penetration hole denoted by 411-5→a land denoted by 310LR3→a plate conductor wire denoted by 310-3→a land denoted by 310LL3→a penetration hole denoted by 412-6→a land denoted by 510LL3→a plate conductor wire denoted by 510-4.

Next, connection of the coil is performed as follows: the plate conductor wire denoted by 510-4→a land denoted by 510LR4→a penetration hole denoted by 411-7→a land denoted by 310LR4→a plate conductor wire denoted by 310-4→a land denoted by 310LL4→a penetration hole denoted by 412-8→a land denoted by 510L14→a plate conductor wire denoted by 510-5.

Lastly, connection of the coil is performed as follows: the plate conductor wire denoted by 510-5→a land denoted by 510LR5→a penetration hole denoted by 411-9→a land denoted by 310LR5→a plate conductor wire denoted by 310-5→a land denoted by 310LL5→a penetration hole denoted by 412-10→a land denoted by 510LL5→a plate conductor wire denoted by 510-6.

Figure 4B:
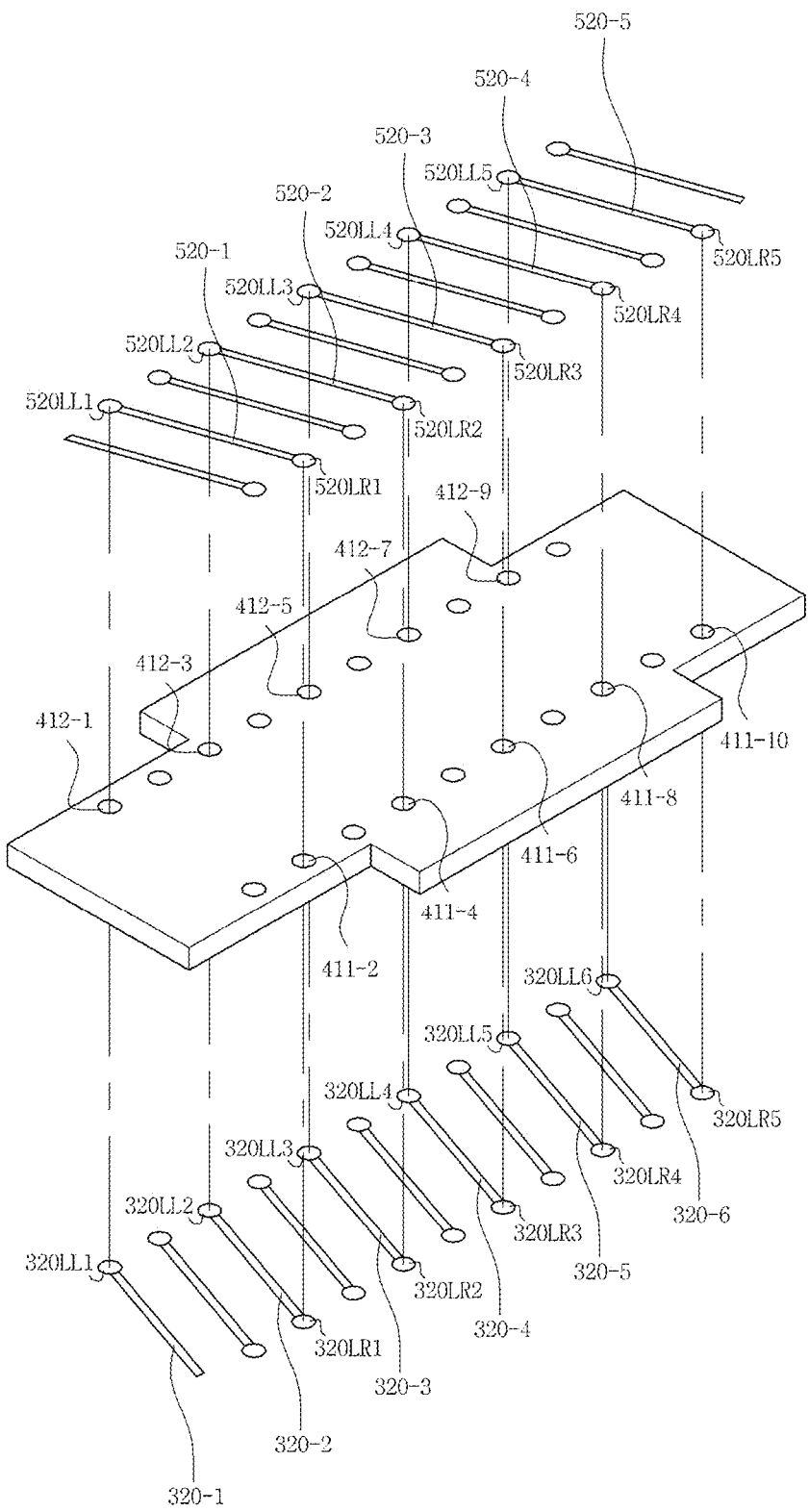

Meanwhile, the connection manner in which the first-layered second coil 320 and the second-layered second coil 520 of the common mode filter constituted as above will be described with reference to FIG. 4B, a detailed separate view of the first circuit layer, the second insulator sheet, and the second circuit layer.

A plate conductor wire 320-1 of the first-layered first coil 320 is a starting point. The plate conductor wire 320-1 passes through a land 320LL1, and, as indicated by a dotted line, passes through a corresponding penetration hole 412-1, and then is connected to a land 520LL1 corresponding to the second-layered second coil 520 and then a plate conductor wire 520-1 of the second-layered second coil 520.

Next, the plate conductor wire 520-1 of the second-layered second coil 520 passes through a land 520LR1, and, as indicated by a dotted line, passes through a corresponding penetration hole 411-2, and then is connected to a land 320LR1 corresponding to the first-layered second coil 320 and then a next plate conductor wire 320-2 of the first-layered second coil 320.

In this manner, connection of the coil is performed as follows: the plate conductor wire denoted by 320-2→a land denoted by 320LL2→a penetration hole denoted by 412-3→a land denoted by 520LL2→a plate conductor wire denoted by 520-2→a land denoted by 520LR2→a penetration hole denoted by 411-4→a land denoted by 320LR2→a plate conductor wire denoted by 320-3.

In succession, connection of the coil is performed as follows: the plate conductor wire denoted by 320-3→a land denoted by 320LL3→a penetration hole denoted by 412-5→a land denoted by 520LL3→a plate conductor wire denoted by 520-3→a land denoted by 520LR3→a penetration hole denoted by 411-6→a land denoted by 320LR3→a plate conductor wire denoted by 320-4.

Next, connection of coil is performed as follows: the plate conductor wire denoted by 320-4→a land denoted by 320LL4→a penetration hole denoted by 412-7→a land denoted by 520LL4→a plate conductor wire denoted by 520-4→a land denoted by 520LR4→a penetration hole denoted by 411-8→a land denoted by 320LR4→a plate conductor wire denoted by 320-5.

Lastly, connection of the coil is performed as follows: the plate conductor wire denoted by 320-5→a land denoted by 320LL5→a penetration hole denoted by 412-9→a land denoted by 520LL5→a plate conductor wire denoted by 520-5→a land denoted by 520LR5→a penetration hole denoted by 411-10→a land denoted by 320LR5→a plate conductor wire denoted by 320-6.

The common mode filter constituted as above can remove common mode noise by alternately arranging the first-layered first coil 310 and the second-layered first coil 510, and the first-layered second coil 320 and the second-layered second coil 520.

In addition, according to the present invention as above, the first coil and the second coil are realized on the same plane in oblique lines, thereby manufacturing a thin film type common mode filter.

Also, according to the present invention, the first coil and the second coil are realized on the same plane in oblique lines, thereby reducing the number of processes, and thus, the process costs can be reduced.

Also, according to the present invention, the first coil and the second coil are realized on the same plane in oblique lines, thereby reducing the number of processes, and thus, the process yield can be increased.

FIGS. 5A to 5K are cross-sectional views showing the flowchart of a method for manufacturing the common mode filter, cut taken along the line X-X of FIG. 1.

Figure 5A:
FIGS. 5A to 5K are cross-sectional views showing the flowchart of a method for manufacturing the common mode filter, cut taken along the line X-X' of FIG. 1.

As shown in FIG. 5A, a base plate in which a first insulator sheet 1110 is laminated on a lower insulator sheet 1000.

Here, the lower insulator sheet 1000 may be formed by using any one selected from $Al_2O_3$, AlN, glass, a quartz substrate.

In addition, any one selected from polyimide, epoxy resin, benzo cyclobutene (BCB), and other polymers is used as a material for the first insulator sheet 1100.

Figure 5B:
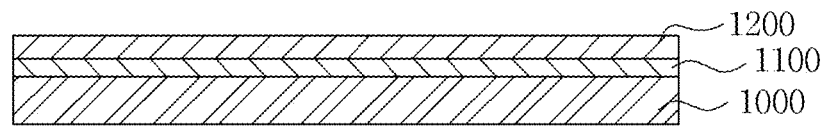

As shown in FIG. 5B, electroless plating and electroplating are performed on the base plate, to form a metal layer 1200. The metal layer 1200 is formed of any one of Ag, Pd, Al, Cr, Ni, Ti, Au, Cu, Pt, and an alloy thereof.

Since the electroless plating is for the insulator sheet 1100, a reaction by electrically charged ions may not be expected.

This electroless plating proceeds by a precipitation reaction, and the precipitation reaction is promoted by a catalyst. In order to precipitate metal from a plating liquid, the catalyst needs to be attached to a surface of a material to be plated. This means that the electroless plating requires a large number of pretreatment processes.

For example, the electroless plating is conducted by including a cleanet process, a soft etching process, a pre-catalyst process, a catalyst treatment process, an accelerator process, an electroless plating process, and an anti-oxidation treatment process.

The above-described electroless plating process causes deterioration in physical properties, as compared with general electroplating, resulting in a thin layer.

After completing the electroless plating, the base plate is immersed in the plating bath, and then electroplating is performed by using a direct current rectifier, to form an electroplating layer. For this electroplating, it is preferable to employ a scheme of precipitating metal by using current suitable for the direct current rectifier, which is obtained by calculating an area to be plated. Electroplating is superior to electroless plating in view of physical properties of the plating layer, and it is easier to form a thick plating layer by electroplating than by electroless plating.

Figure 5C:
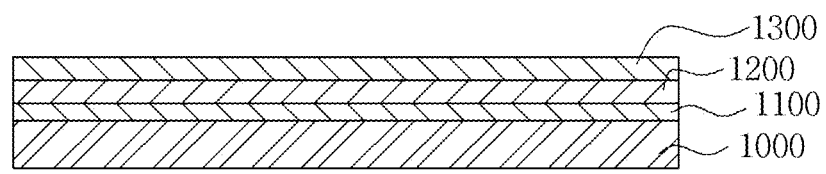

As shown in FIG. 5C, a dry film 1300 is coated thereon, and the dry film 1300 is exposed and developed by using an art work film (not shown) having a predetermined pattern printed thereon, thereby forming an etching resist pattern including patterns for a first-layered first coil 1210 and a first-layered second coil 1220 of a first circuit layer on the dry film 1300.

Here, the dry film 1300 is constituted of three layers of a cover film, a photo-resist film formed of a photosensitive material, and a Mylar film. The photoresist film substantially serves as a resist.

The exposing and developing processes of the dry film 1300 is performed by closely adhering the art work film having a predetermined pattern printed to the dry film 1300, and then irradiating ultraviolet light thereon. Here, the ultraviolet light does not transmit a black portion in which the pattern of the art work film is printed and the ultraviolet light transmits a portion in which the pattern of the art work film is not printed, thereby curing the dry film 1300 under the art work film.

When the base plate having the cured dry film 1300 is immersed in a developing solution, an uncured portion of the dry film 1300 is removed by the developing solution and the cured portion of the dry film 1300 remains, thereby forming an etching resist pattern. Here, a sodium carbonate ($Na_2CO_3$) aqueous solution, a potassium carbonate ($K_2CO_3$) aqueous solution, or the like is used as the developing solution.

Figure 5D:
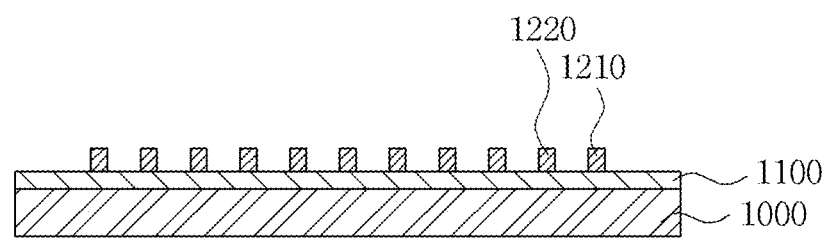

As shown in FIG. 5D, the metal layer 1200 is etched by using the dry film 1300 as an etching resist, to form a first-layered first coil 1210 and a first-layered second coil 1220 on the metal layer 1200 of the base plate.

Here, the first-layered first coil 1210 is constituted of a plurality of plate conductor wires alternately formed and a plurality of lands formed at both ends of the respective plate conductor wires.

In addition, the first-layered second coil 1220 is constituted of a plurality of plate conductor wires alternately formed and a plurality of lands formed at both ends of the respective plate conductor wires.

Then, the dry film 1300 is removed by using a stripper liquid of sodium hydroxide (NaOH), potassium hydroxide (KOH), or the like.

Figure 5E:
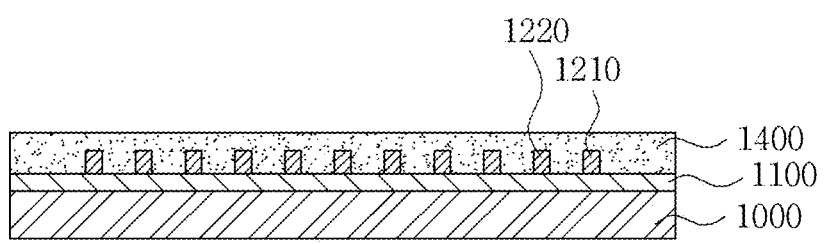

Then, as shown in FIG. 5E, a liquid state of photosensitive material which is photosensitive to ultraviolet light is coated on the base plate, to form a second insulator sheet 1400, and then dried. Then, the photosensitive material is exposed and developed by using an art work film having a predetermined pattern, to form a plurality of holes corresponding to the plurality of lands of the first-layered first coil 1210 and the plurality of lands of the first-layered second coil 1220 in the photosensitive material.

Here, as the method of coating the liquid state of photosensitive material, a dip coating method, a roll coating method, an electro-deposition method, or the like may be employed.

Meanwhile, the second insulator sheet 1400 may be formed by using any one selected from polyimide, epoxy resin, benzo cyclobutene (BCB), and other polymers, and the holes may be formed by using laser drill. In this case, the layer drill is preferably performed by using carbon dioxide laser drill.

Figure 5F:
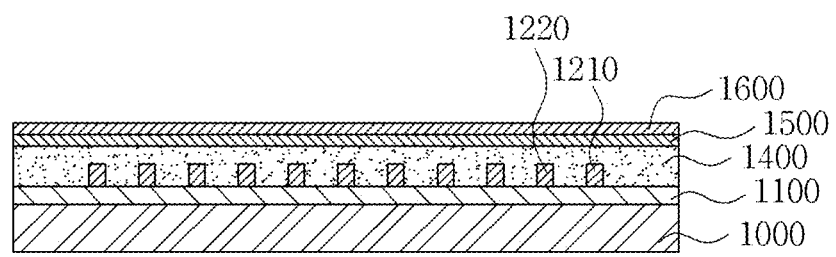

Meanwhile, as shown in FIG. 5F, metal layers 1500 and 1600 as a preform of the second circuit layer are formed on an upper surface of the second insulator sheet 1400. The metal layers 1500 and 1600 are formed of any one of Ag, Pd, Al, Cr, Ni, Ti, Au, Cu, Pt, and an alloy thereof.

In order to perform electric connection through the formed holes and electroplating, electroless plating is performed to form an electroless plating layer 1500 and then electroplating is performed to form an electroplating layer 1600, thereby completing the metal layers 1500 and 1600.

When the holes are filled with a conductive material by the electroless plating layer 1500 and the electroplating layer 1600, the holes become penetration holes having conductivity.

Figure 5G:
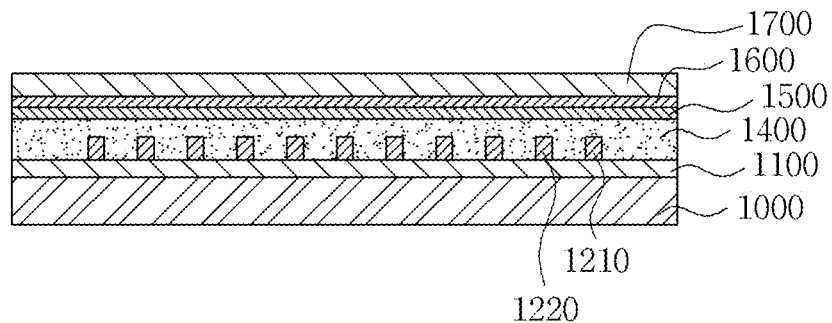

As shown in FIG. 5G, a dry film 1700 is coated on the metal layer 1600, and then exposed and developed by using an art work film (not shown) having a predetermined pattern printed thereon, thereby forming an etching resist pattern including circuit patterns for a first coil 1510 and 1610 and a second coil 1520 and 1620 of the second circuit layer in the dry film 1700.

Figure 5H:
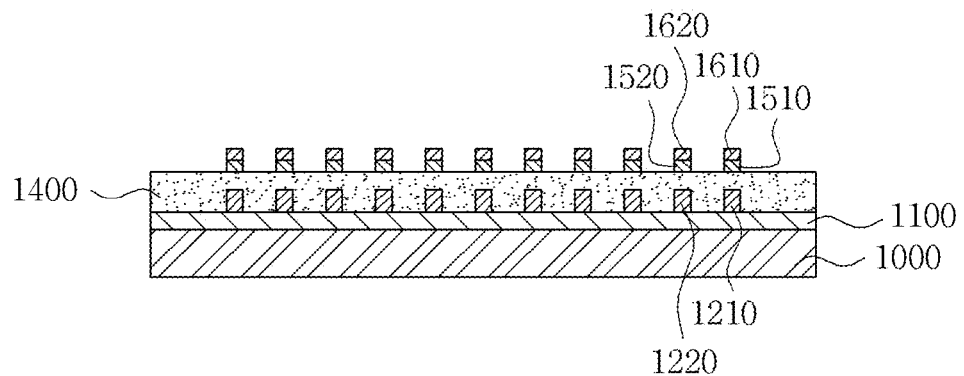

As shown in FIG. 5H, the metal layers 1500 and 1600 are etched by using the dry film 1700 as an etching resist, to form the first coil 1510 and 1610 and the second coil 1520 and 1620 of the second circuit layer.

Then, the dry film 1700 is removed by using a stripper liquid of sodium hydroxide (NaOH), potassium hydroxide (KOH), or the like.

Also, in the above-described processes as shown in FIGS. 5G and 5H, the first coil and the second coil of the second circuit layer may be formed by using a liquid state of photosensitive material as an etching resist.

Figure 5I:
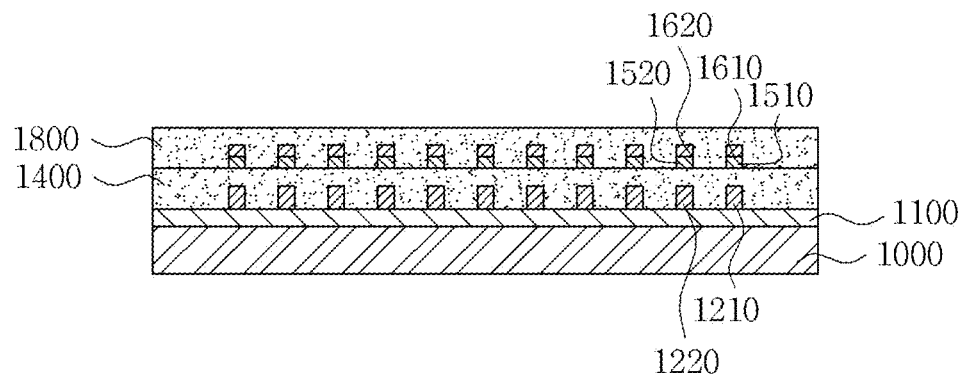

Then, as shown in FIG. 5I, an upper insulator sheet 1800 is laminated on the second circuit layer constituted of the second-layered first coil 1510 and 1610 and the second-layered second coil 1520 and 1620.

Here, the upper insulator sheet 1800 may be formed by using any one selected from polyimide, epoxy resin, benzo cyclobutene (BCB), and other polymers.

Figure 5J:
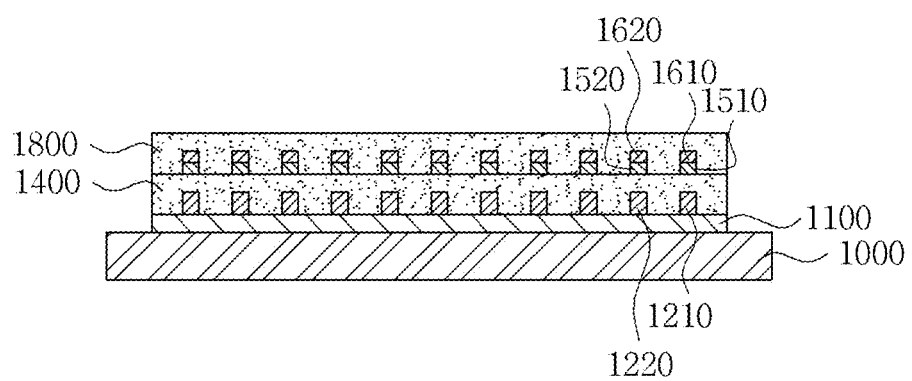

Then, as shown in FIG. 5J, lateral surfaces of the laminate consisting of from the first insulator sheet 1100, which is laminated on the lower insulator sheet 1000, to the upper insulator sheet 1800 are removed by using various etching processes.

Figure 5K:
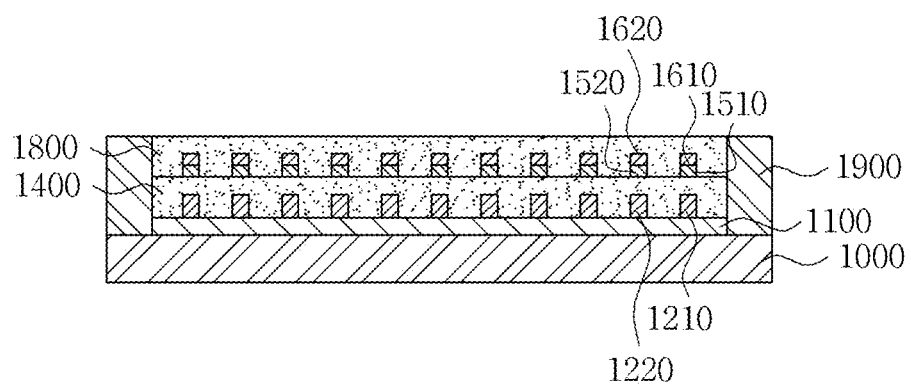

Then, as shown in FIG. 5K, a pair of input and output electrodes 1900 are attached to the etched portions. These input and output electrodes 1900 may be attached by using various adhesive agents.

As set forth above, according to the present invention as above, the first coil and the second coil are realized on the same plane in oblique lines, thereby manufacturing a thin film type common mode filter having a two-layered lamination structure.

Further, according to the present invention, the first coil and the second coil are realized on the same plane in oblique lines, thereby reducing the number of processes, and thus, the process costs can be reduced.

Further, according to the present invention, the first coil and the second coil are realized on the same plane in oblique lines, thereby reducing the number of processes, and thus, the process yield can be increased.

It will be apparent to those skilled in the art that the foregoing present invention is not limited by the foregoing embodiments and the accompanying drawings but by the claims, and various modifications and changes may be made without departing from the scope and spirit of the invention.

What is claimed is:

1. A common mode filter, comprising:
    a first insulator sheet;
    a first circuit layer formed on the first insulator sheet and having a first-layered first coil and a first-layered second coil alternately and separately arranged;
    a second insulator sheet laminated on the first circuit layer and having a pair of penetration hole rows constituted of a plurality of penetration holes connected to the first-layered first coil and the first-layered second coil; and
    a second circuit layer formed on the second insulator sheet and having a second-layered first coil and a second-layered second coil alternately and separately arranged, the second-layered first coil being connected to the first-layered first coil and the second-layered second coil being connected to the first-layered second coil through the plurality of penetration holes,
    wherein the second insulator sheet is formed of a photosensitive material, and an impedance of the common mode filter is controlled by a thickness of the first insulator sheet, and
    wherein the first insulator sheet is formed of any one of polyimide, epoxy resin, benzo cyclobutene (BCB), and other polymers.

2. The common mode filter as set forth in claim 1, further comprising:
    a third insulator sheet formed on a surface opposite to a surface of the first insulator sheet on which the first circuit layer is formed; and
    a fourth insulator sheet laminated on the second circuit layer.

3. The common mode filter as set forth in claim 1, wherein the first-layered first coil of the first circuit layer has plate conductor wires disposed in oblique lines and arranged alternately with each other, and the first-layered second coil of the first circuit layer has plate conductor wires disposed in oblique lines and arranged alternately with the plate conductor wires of the first-layered first coil.

4. The common mode filter as set forth in claim 1, further comprising a pair of input and output electrodes formed on lateral surfaces of a laminate consisting of the first insulator sheet, the first circuit layer, the second insulator sheet, and the second circuit layer.

5. The common mode filter as set forth in claim 1, wherein the second-layered first coil of the second circuit layer has plate conductor wires disposed in oblique lines and arranged alternately with each other, and the second-layered second coil of the second circuit layer has plate conductor wires disposed in oblique lines and arranged alternately with the plate conductor wires of the second-layered first coil.

6. A common mode filter, comprising:
  a first insulator sheet;
  a first circuit layer formed on the first insulator sheet and having a first-layered first coil and a first-layered second coil alternately and separately arranged;
  a second insulator sheet laminated on the first circuit layer and having a pair of penetration hole rows constituted of a plurality of penetration holes connected to the first-layered first coil and the first-layered second coil;
  a second circuit layer formed on the second insulator sheet and having a second-layered first coil and a second-layered second coil alternately and separately arranged, the second-layered first coil being connected to the first-layered first coil and the second-layered second coil being connected to the first-layered second coil through the plurality of penetration holes;
  a third insulator sheet formed on a surface opposite to a surface of the first insulator sheet on which the first circuit layer is formed; and
  a fourth insulator sheet laminated on the second circuit layer,
  wherein the second insulator sheet is formed of a photosensitive material, and an impedance of the common mode filter is controlled by the thickness of the first insulator sheet, and
  wherein the third insulator sheet is formed of any one of $Al_2O_3$, AlN, glass, and a quartz substrate.

7. A method for manufacturing a common mode filter, comprising:
  (A) forming a first circuit layer on a first insulator sheet, the first circuit layer having a first-layered first coil and a first-layered second coil alternately and separately arranged;
  (B) forming a second insulator sheet on the first circuit layer, the second insulator sheet having a plurality of holes corresponding to lands of the first-layered first coil and lands of the first-layered second coil;
  (C) forming penetration holes in the second insulator sheet by performing plating on the second insulator sheet to fill the penetration holes with a conductive material, and forming a metal layer on the second insulator sheet; and
  (D) forming a second circuit layer by using the metal layer, the second circuit layer having a second-layered first coil and a second-layered second coil alternately and separately arranged, and the second-layered first coil being connected to the first-layered first coil and the second-layered second coil being connected to the first-layered second coil through the plurality of penetration holes,
  (E) preparing a third insulator sheet on a surface opposite to a surface of the first insulator sheet on which the first circuit layer is formed, and laminating the first insulator sheet on the third insulator sheet, before step (A); and
  (F) laminating a fourth insulator sheet on the second circuit layer, after step (C)
  wherein the third insulator sheet is formed of any one of $Al_2O_3$, AlN, glass, and a quartz substrate.

8. The method as set forth in claim 7, further comprising (G) forming a pair of input and output electrodes on lateral surfaces of a laminate consisting of the first insulator sheet, the first circuit layer, the second insulator sheet, and the second circuit layer.

9. The method as set forth in claim 7, wherein the first insulator sheet is formed of any one of polyimide, epoxy resin, benzo cyclobutene (BCB), and other polymers.

10. The method as set forth in claim 7, wherein the second insulator sheet is formed of any one of a photosensitive material, polyimide, epoxy resin, benzo cyclobutene (BCB), and other polymers.

11. The method as set forth in claim 7, wherein step (B) includes:
  (B-1) coating and drying a liquid state photosensitive material on the first circuit layer to form the second insulator sheet; and
  (B-2) forming the plurality of holes corresponding to the lands of the first-layered first coil and the lands of the first-layered second coil in the second insulator sheet by exposing and developing the second insulator sheet.

* * * * *